United States Patent
Belke, Jr. et al.

(10) Patent No.: US 6,998,540 B2
(45) Date of Patent: Feb. 14, 2006

(54) ELECTRICAL CIRCUIT BOARD AND A METHOD FOR MAKING THE SAME

(75) Inventors: Robert Edward Belke, Jr., West Bloomfield, MI (US); Vivek A. Jairazbhoy, Farmington Hills, MI (US); Thomas B. Krautheim, Belleville, MI (US); William F. Quitty, Jr., Levittown, PA (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 285 days.

(21) Appl. No.: 10/426,326

(22) Filed: Apr. 29, 2003

(65) Prior Publication Data

US 2003/0213767 A1 Nov. 20, 2003

Related U.S. Application Data

(62) Division of application No. 09/655,985, filed on Sep. 6, 2000, now Pat. No. 6,585,903.

(51) Int. Cl.
*H01R 12/04* (2006.01)

(52) U.S. Cl. .................. 174/263; 216/13; 174/264; 174/265; 174/266; 29/830; 439/66; 439/69; 439/74; 361/792; 361/793; 361/794; 361/795

(58) Field of Classification Search ............... 216/13; 174/262–266; 361/792–795; 438/66, 69, 438/74; 29/830; 439/66, 69, 74

See application file for complete search history.

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 4,601,916 A | | 7/1986 | Arachtingi |
| 5,544,773 A | | 8/1996 | Haruta et al. |
| 5,590,460 A | | 1/1997 | DiStefano et al. |
| 5,638,598 A | * | 6/1997 | Nakaso et al. ............. 29/852 |
| 5,690,460 A | * | 11/1997 | Attanasio ................. 411/551 |
| 5,738,797 A | | 4/1998 | Belke, Jr. et al. |
| 5,763,060 A | | 6/1998 | Kerrick |
| 5,819,401 A | * | 10/1998 | Johannes et al. ........... 29/830 |
| 5,863,446 A | | 1/1999 | Hanson |

* cited by examiner

*Primary Examiner*—Shamim Ahmed
(74) *Attorney, Agent, or Firm*—Brinks Hofer Gilson & Lione

(57) ABSTRACT

A multi-layer electronic circuit board design 10 having selectively formed apertures or cavities 26 which have improved solder-wetting characteristics.

18 Claims, 6 Drawing Sheets

ELECTRICAL CIRCUIT BOARD AND A METHOD FOR MAKING THE SAME

"This application is a division of application Ser. No. 09/655,985 filed on Sep. 6, 2000, U.S. Pat. No. 6,585,903".

FIELD OF THE INVENTION

The present invention relates to a method for making an electrical circuit board and more particularly, to a method for making a multi-layer electrical circuit board having apertures and/or cavities which are formed within the circuit board and/or through various portions of the circuit board, and which provide for improved and/or more reliable solder interconnections between portions or layers of the circuit board.

BACKGROUND OF THE INVENTION

Multi-layer circuit boards contain and/or include electrical components and interconnecting conductive traces or routing lines which selectively and operatively populate opposed first and second surfaces (i.e., top and bottom surfaces) of each board (or other respective interior portions of each of the boards), thereby desirably allowing each of the electrical circuit boards to contain and/or include a relatively large amount of electrical components and conductive traces which efficiently and densely populate the respective boards.

It is desirable to allow for communication by and between and/or interconnection of the component containing conductive surfaces and/or portions of an electrical circuit board, thereby allowing the contained electrical components and traces on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

This desired interconnection typically requires one or more holes or cavities to be drilled and/or formed through the core of the circuit board substrate, thereby selectively creating one or more "through-hole" type vias or apertures (i.e., holes which pass through and/or traverse the entire circuit board or all of the opposed component containing surfaces), and one or more "blind" type vias or apertures (i.e., holes which do not pass through and/or traverse the entire circuit board and all of the opposed component containing surfaces). The vias are then typically filled with solder (e.g., a pin or component connector is soldered into the hole). In this manner, electrical connections are made or formed which connect electrical components and/or circuitry to the core of the circuit board substrate, or to other components and/or circuitry located on the opposing side or surface of the board.

One drawback associated with these conventional vias and with this circuit board design is that layers of relatively non-solderable material (i.e., insulating material and/or material which does not substantially bind or metallurgically bond with solder) are typically present within these vias, and thus, the solder does not consistently and reliably electrically connect the desired layers of circuitry and/or components together. For example and without limitation, portions or layers of non-solderable material often "overhang" or project beyond conductive layers or portions of the circuit board, which are typically "etched back" or recessed within the insulating portions or layers. This arrangement often results in a void which is not filled by the relatively high-tension solder material, thereby substantially preventing or reducing the likelihood of the solder material "wetting" or metallurgically bonding to the conducting portions or layers of the circuit board. Hence, these types of arrangements often result in a defective portion or region of the circuit board where all layers of the circuit board are not desirably interconnected.

There is therefore a need for a method for producing a multi-layer electrical circuit board which overcomes some or all of the previously delineated drawbacks of prior circuit boards and which includes vias or cavities which provide for improved solder interconnections between one or more layers of electrical circuitry.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the present invention to provide a method for making a multi-layer electrical circuit board which includes one or more vias, apertures or cavities which provide for highly reliable and solderable interconnections between conductive layers or portions of the circuit board.

It is a third object of the invention to provide a method for producing a multi-layer electrical circuit board which overcomes some or all of the previously delineated drawbacks of prior multi-layer electrical circuit board forming methodologies and techniques and which allows for the selective, efficient, and reliable formation of apertures or cavities, which allows for communication by and between some or all of the various component containing surfaces and portions of the formed multi-layer electrical circuit board, which selectively allows components contained within and/or upon these portions and surfaces to be interconnected, and which is further adapted to selectively and communicatively receive an electrical component and/or an electrical component connector portion.

According to a first aspect of the present invention a method is provided for forming a solder connection within a multi-layer circuit board having a first conductive layer, and a first and a second insulating layer, the first conductive layer being disposed between the first and the second insulating layer. The method includes the steps of: forming a first aperture through the first conductive layer, the first insulating layer and the second insulating layer; forming a second aperture through the first conductive layer, the first insulating layer and the second insulating layer, the second aperture being formed in relative close proximity to the first aperture, effective to cause at least a first portion of the first layer and at least a second portion of the second layer to separate from a third portion of the first conductive layer, thereby exposing the third portion of the first conductive layer; and wetting the third portion with a solder material, thereby metallurgically bonding the solder material to the first conductive layer.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1:
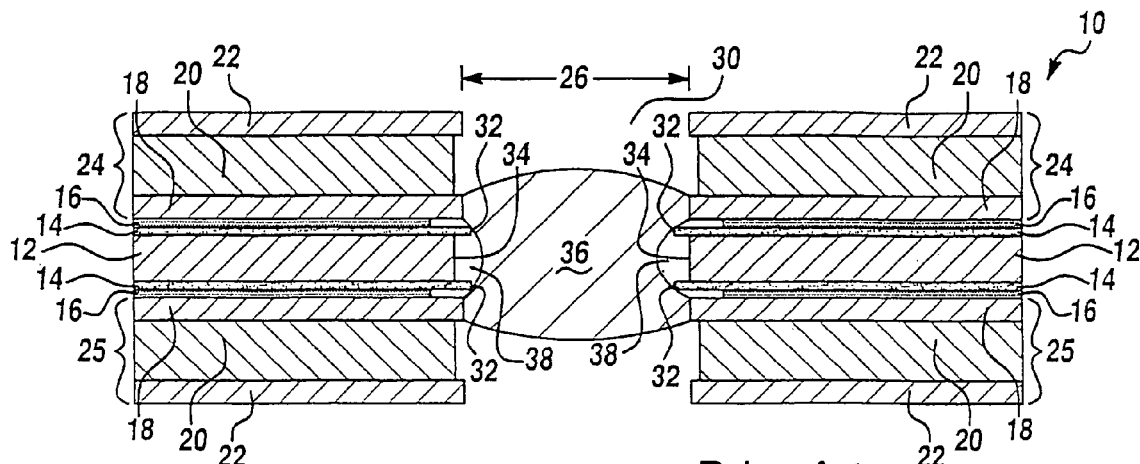
FIG. 1 is a sectional side view of a multi-layer circuit board including a solder-filled aperture made in accordance with the teachings of the prior art.

Referring now to FIG. 1, there is shown a circuit assembly 10 including a "through-hole", via or aperture 30, which is made or formed in accordance with the teachings of the prior art. Circuit assembly 10 is formed by "building up" or sequentially adding various layers of certain materials to a core member 12, in a conventional manner. Core member 12 is manufactured and/or formed from an electrically conductive material such as copper or a metallic and electrically conductive foil material. A pair of substantially identical layers of dielectric material or conventional epoxy 14 are respectively applied/coupled to and substantially "cover" the "top" and "bottom" surfaces of member 12. Two layers of conventional adhesive material 16 are applied/coupled to and substantially "cover" or coat the respective "outer" surface of each epoxy layer 14.

Circuit assembly 10 further includes a pair of pre-circuit assemblies 24, 25. Each pre-circuit assembly 24, 25 includes a core metal portion 20 which is preferably manufactured and/or formed from a conventional aluminum material, and a pair of electrically conductive layers 18, 22, which are respectively attached to the opposing surfaces of core metal portion 20 and which are preferably manufactured and/or formed from a conventional copper material. While copper and aluminum are used to form circuit board 10, it should be appreciated that other metals and metal combinations can be used to form circuit board 10 and all of the other circuit boards described herein, and may include metals such as iron, nickel, silver, gold, tin and alloys thereof. An adhesive material or layer 16 is disposed between each dielectric layer 14 and the pre-circuit assemblies 24, 25 and operatively bonds the conductive layer 18 of each pre-circuit assembly 24, 25 to each dielectric layer 14. In one non-limiting embodiment of the invention, pre-circuit assemblies 24, 25 and/or electrically conductive members 18 are connected, coupled, and/or attached to adhesive layers 16 and dielectric layers 14 by use of a known and conventional laminating process such as a conventional "one-step" laminating process, which may include, by way of example and without limitation, vacuum pressure assist autoclaving, open face lamination or roll lamination.

Certain portions of pre-circuit assemblies 24, 25, adhesive layers 16, dielectric layers 14 and core 12 have been removed from an area or region 26 of the circuit assembly 10 in a known and conventional manner such as by drilling, punching, laser ablation and/or selective etching, thereby creating an aperture or "via" 30 which passes through or traverses circuit assembly 10. In the preferred embodiment, portions of pre-circuit assemblies 24, 25 are removed from region 26 and/or aperture 30 by use of a selective etching process. As a result of the conventional etching process, portions 32 of dielectric material 14 project or extend over the end surfaces 34 of core 12 (i.e., end surfaces 34 of core 12 are recessed within dielectric layers 14). Due to these overhanging portions 32 and the relatively high surface tension of material 36, when solderable material 36 is introduced or inserted into aperture 30, the material or "solder slug" 36 tends to form the shape illustrated in FIG. 1. Hence, void areas 38 are formed within aperture 30 which prevent the solder material 36 from contacting or wetting the end surfaces 34 of conductive core 12, thereby substantially preventing conductive layers 18 and/or any component pins or connectors which are selectively inserted into aperture 30 from being physically and electrically connected to conductive core 12.

Figure 2:
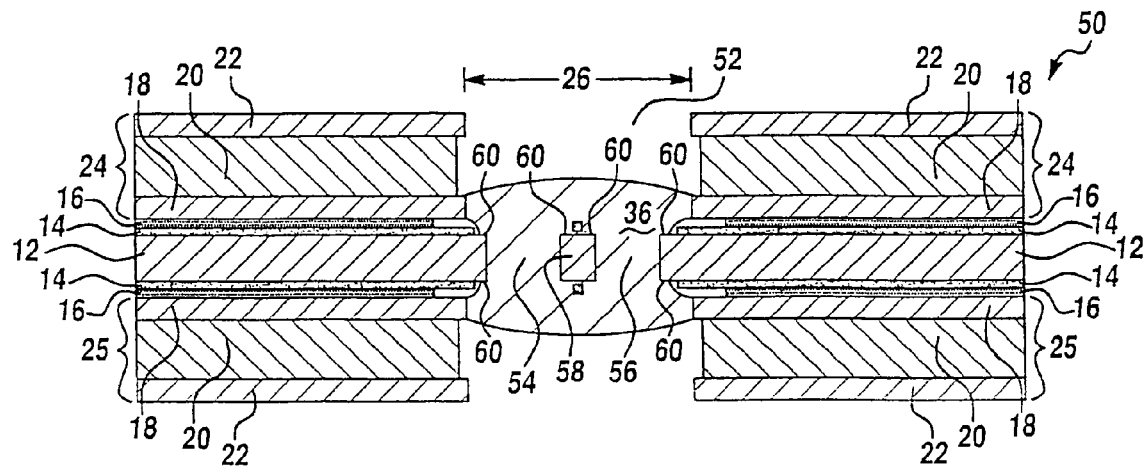
FIG. 2 is a sectional side view of a multi-layer circuit board including a solder-filled aperture made in accordance with the teachings of a preferred embodiment of the invention.
Figure 3:
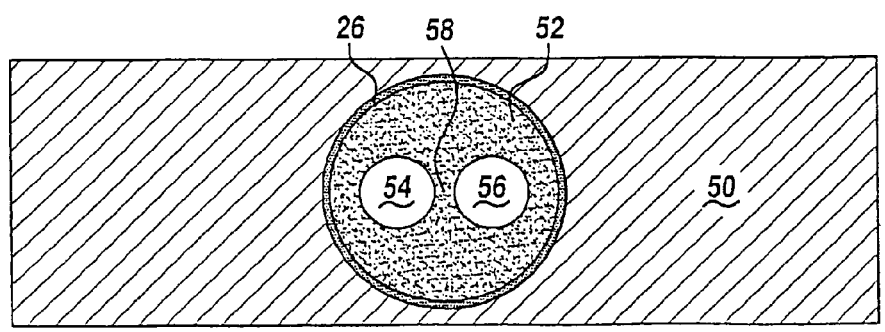
FIG. 3 is a top view of the multi-layer circuit board shown in FIG. 2.

Referring now to FIGS. 2 and 3, there is shown a circuit assembly 50 which is made in accordance with the teachings of a preferred embodiment of the invention. Circuit assembly 50 is substantially identical to circuit assembly 10 with the exception that via or aperture 30 has been replaced with via or aperture 52 which is made in accordance with the teachings of the preferred embodiment of the invention.

Particularly, to form aperture 52, portions of pre-circuit assemblies 24, 25 and portions of adhesive layers 16 are first removed from area or region 26 of the circuit assembly 10 in a known and conventional manner such as by drilling, punching, routing, milling, machining and/or selective etching. In the preferred embodiment, the portions of pre-circuit assemblies 24, 25 are removed by use of a selective etching process, and area or region 26 is generally circular or cylindrical in shape. Once the portions of pre-circuit assemblies 24, 25 and portions of adhesive layers 16 are removed from area or region 26, two apertures or holes 54, 56 are formed within dielectric layers 14 and core 12. In the preferred embodiment, apertures 54, 56 are formed by a conventional machining process, such as drilling, routing, stamping, laser ablation, cutting or punching and are formed in relative close proximity to each other. In alternate embodiments, apertures 54, 56 may be also formed by an etching or chemical milling process. Apertures 54, 56 are separated by a relatively narrow "bridge" or strip 58 of core 12 and dielectric material 14.

Importantly, when apertures 54, 56 are machined, the relatively brittle dielectric coating 14 chips, flakes or otherwise separates off of the end portions or corner regions 60 of core 12, as illustrated in FIG. 2. These "exposed" portions 60 of core 12 substantially ensure that solder material or other conductive materials introduced or inserted into aperture 52 wets or metallurgically bonds with core 12. The terms "solder material" and "conductive materials" as which are used interchangeably herein should be understood to include materials such as metal-filled polymers and inks, brazing or welding materials and any or all binary, ternary or quaternary multiphasic metal materials. As shown in FIG. 2, the solder material, conductive material, or "solder slug" 36 which is inserted into aperture 52 substantially contacts and wets the exposed portions 60 of core 12 and forms a robust and reliable physical and electrical connection between conductive members or layers 18 and ground or core member 12.

Figure 4:
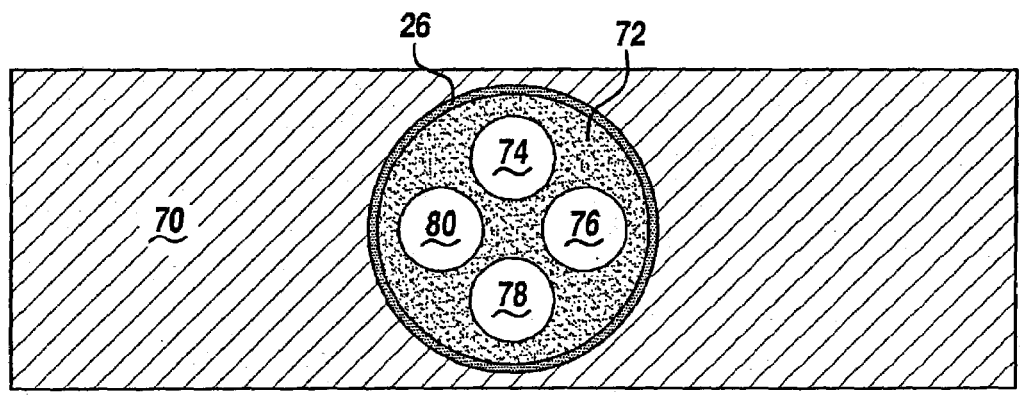
FIG. 4 is a top view of a multi-layer circuit board made in accordance with the teachings of a second embodiment of the present invention.

Referring now to FIG. 4, there is shown a circuit assembly 70 made in accordance with the teachings of a second embodiment of the present invention. Circuit assembly 70 is substantially identical to circuit assembly 50 with the exception that via or aperture 52 has been replaced with via or aperture 72.

Via or aperture 72 includes four holes or apertures 74, 76, 78 and 80 which are formed within dielectric layers 14 and core 12. Apertures 74, 76, 78 and 80 are formed by a conventional machining process such as drilling, laser ablation, routing, stamping, cutting or punching and are formed in relative close proximity to each other. In alternate embodiments, apertures 74–80 may be formed by an etching or chemical milling process. When apertures 74–80 are machined, the relatively brittle dielectric coating 14 chips, flakes or otherwise separates off of the end portions or corner regions of core 12, in a manner substantially similar to that described in reference to circuit assembly 50. The formation of four apertures 74–80 provides additional "exposed" portions of core 12 which further ensure that solder and or conductive material introduced or inserted into aperture 72 wets or metallurgically bonds with core 12.

Figure 5:
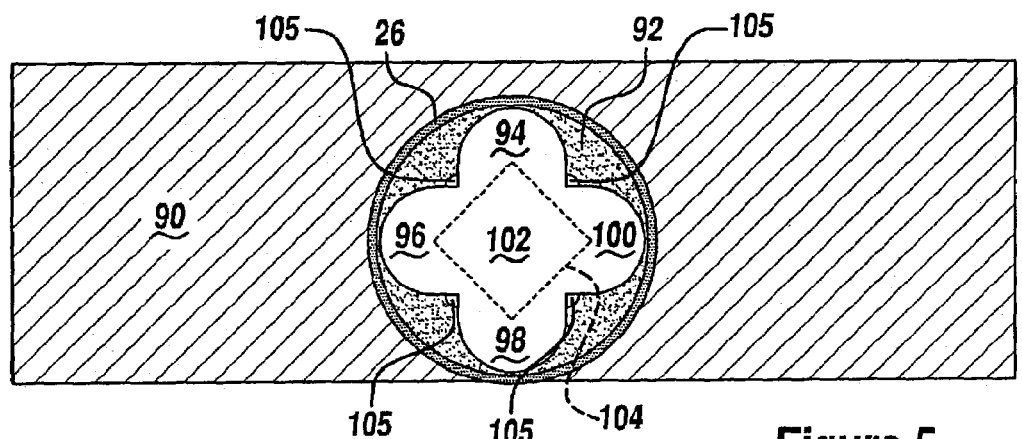
FIG. 5 is a top view of a multi-layer circuit board made in accordance with the teachings of a third embodiment of the present invention.

Referring now to FIG. 5, there is shown a circuit assembly 90 made in accordance with the teachings of a third embodiment of the present invention. Circuit assembly 90 is substantially identical to circuit assembly 70 with the exception that via or aperture 72 has been replaced with via or aperture 92.

Via or aperture 92 includes four intersecting and generally circular holes 94, 96, 98, and 100 which interconnect and/or overlap to form one hole or aperture 102 within dielectric layers 14 and core 12. Apertures 94, 96, 98, and 100 are formed by a conventional machining process, such as drilling, routing, stamping, cutting, punching, or laser ablation and are formed in a substantially "square" arrangement as indicated by dashed line 104 (e.g., the center of each aperture 13 located at the four corners of square 104). In alternate embodiments, apertures 74–80 may be found by an etching or chemical milling process. When apertures 94–100 are machined, the relatively brittle dielectric coating 14 chips, flakes or otherwise separates off of the end portions or corner regions 105 of core 12, in a manner substantially similar to that described with reference to circuit assembly 50. The formation of aperture 102 in the "square" arrangement 104 provides additional "exposed" portions of core 12 (e.g. portions 105) which ensure that solder or other electrically conductive material introduced or inserted into aperture 102 wets or metallurgically bonds with core 12.

Figure 6:
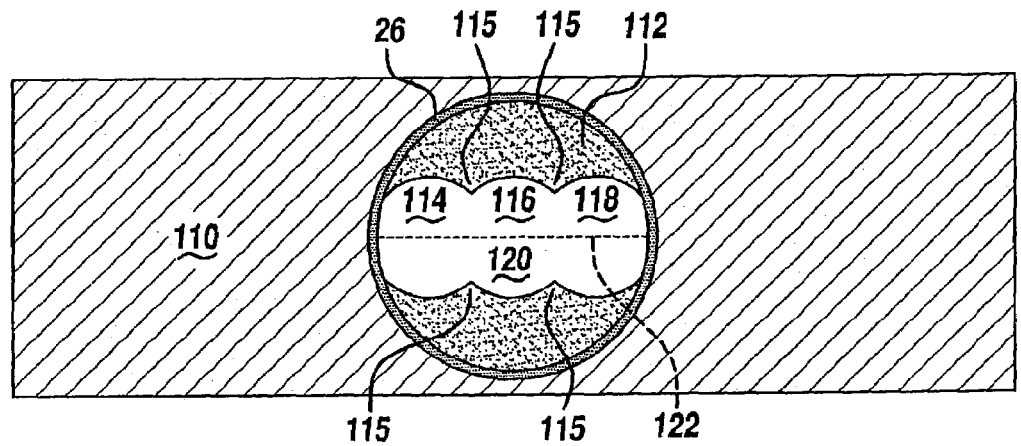
FIG. 6 is a top view of a multi-layer circuit board made in accordance with the teachings of a fourth embodiment of the present invention.

Referring now to FIG. 6, there is shown a circuit assembly 110 made in accordance with the teachings of a fourth embodiment of the present invention. Circuit assembly 110 is substantially identical to circuit assembly 90 with the exception that via or aperture 92 has been replaced with via or aperture 112.

Via or aperture 112 includes three intersecting and generally circular holes 114, 116, and 118 which interconnect and/or overlap to form one hole or aperture 120 within dielectric layers 14 and core 12. Apertures 114, 116, and 118 are formed by a conventional etching or machining process, such as drilling, routing, stamping, cutting, punching or laser ablation and are formed in a substantially linear arrangement as indicated by dashed line 122. When apertures 114–118 are machined, the relatively brittle dielectric coating 14 chips, flakes or otherwise separates off of the end portions or corner regions of core 12, in a manner substantially similar to that described with reference to circuit assembly 50. The formation of aperture 102 with its linear arrangement 122 provides additional "exposed" portions of core 12 (e.g. projections 115) which ensure that solder or other electrically conductive material introduced or inserted into aperture 112, 120 wets or metallurgically bonds with core 12.

Figure 7:
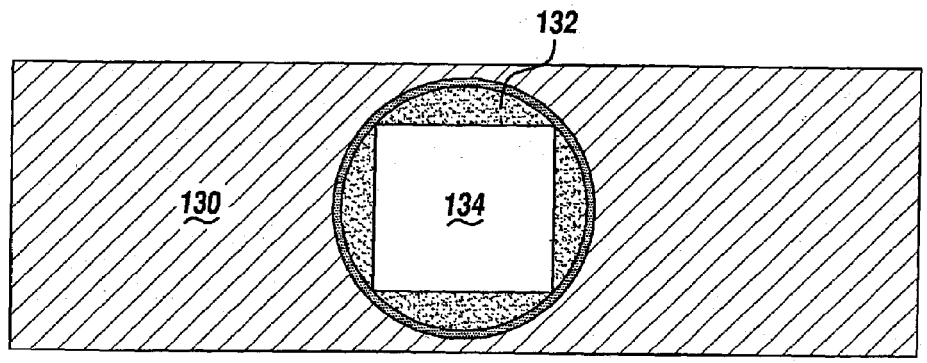
FIG. 7 is a top view of a multi-layer circuit board made in accordance with the teachings of a fifth embodiment of the present invention.

Referring now to FIG. 7, there is shown a circuit assembly 130 made in accordance with the teachings of a fifth embodiment of the present invention. Circuit assembly 130 is substantially identical to circuit assembly 50 with the exception that via or aperture 52 has been replaced with via or aperture 132.

Via or aperture 132 includes a substantially square shaped hole 134 within dielectric layers 14 and core 12. Aperture 134 is formed by a conventional process, such as drilling, etching, chemical milling, laser ablation, routing, stamping, cutting or punching. When aperture 134 is formed, the relatively brittle dielectric coating 14 chips, flakes or otherwise separates off of the end portions or corner regions of core 12, in a manner substantially similar to that described with reference to circuit assembly 50. The formation of aperture 134 provides additional "exposed" portions of core 12 which ensure that solder or other electrically conductive material introduced or inserted into apertures 132, 134 wets or metallurgically bonds with core 12.

Figure 8:
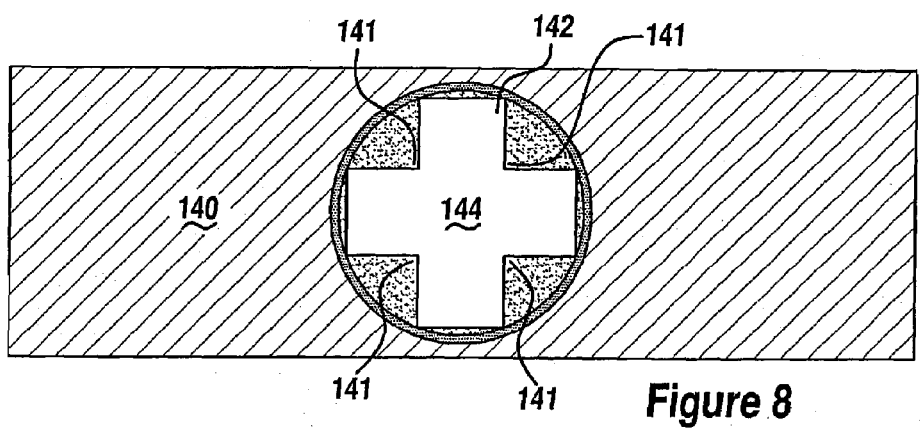
FIG. 8 is a top view of a multi-layer circuit board made in accordance with the teachings of a sixth embodiment of the present invention.

Referring now to FIG. 8, there is shown a circuit assembly 140 made in accordance with the teachings of a sixth embodiment of the present invention. Circuit assembly 140 is substantially identical to circuit assembly 50 with the exception that via or aperture 52 has been replaced with via or aperture 142.

Via or aperture 142 includes an aperture or a hole 144 within dielectric layers 14 and core 12. Aperture 144 is formed by a conventional process, such as drilling, routing, etching, chemical milling, laser ablation, stamping, cutting or punching such that aperture 144 is generally "cross-shaped." When aperture 144 is formed, the relatively brittle dielectric coating 14 chips, flakes or otherwise separates off of the end portions or corner regions of core 12, in a manner substantially similar to that described with reference to circuit assembly 50. The formation of aperture 144 with its substantially "cross" like shape provides additional "exposed" portions of core 12 (e.g. projections 141) which ensure that solder or other electrically conductive material introduced or inserted into aperture 142, 144 wets or metallurgically bonds with core 12.

Figure 9:
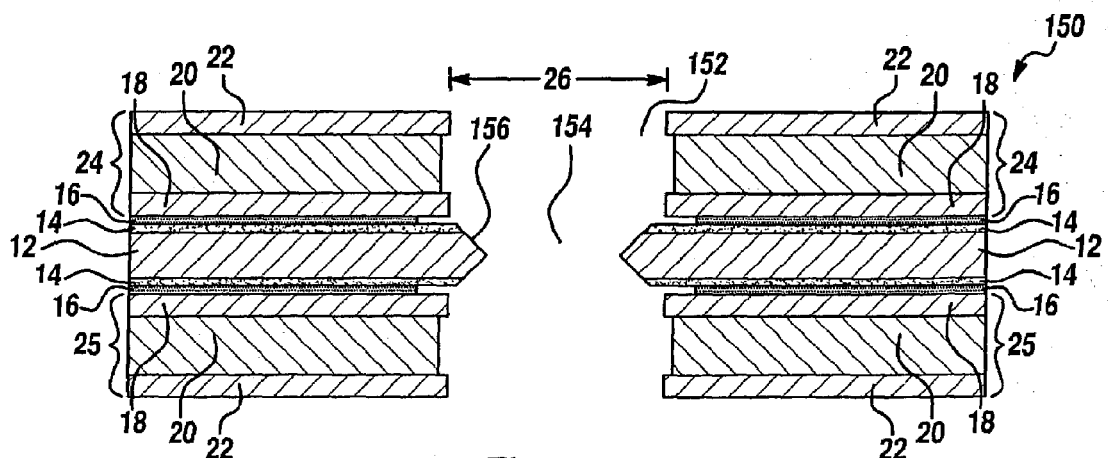
FIGS. 9 and 9a are sectional side views of a multi-layer circuit board including an aperture made in accordance with the teachings of a seventh embodiment of the invention.
Figure 9A:
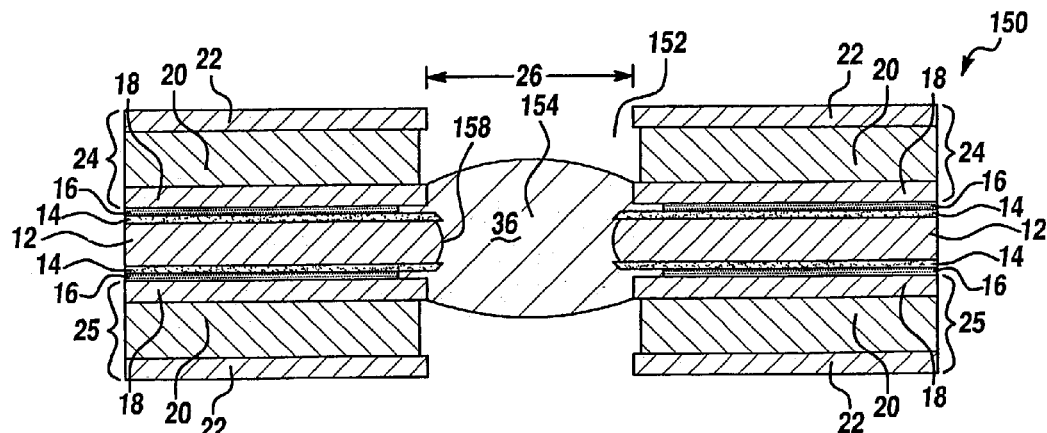

Referring now to FIGS. 9 and 9a, there is shown a circuit assembly 150 made in accordance with the teachings of a seventh embodiment of the invention. Circuit assembly 150 is substantially identical to circuit assembly 50 with the exception that via or aperture 52 has been replaced by via or aperture 152.

Particularly, to form aperture 152, portions of pre-circuit assemblies 24, 25 and adhesive layers 16 are first removed from area or region 26 of the circuit assembly 150 in a known and conventional manner such as by drilling, laser ablation, punching, and/or selective etching. In the preferred embodiment, the portions of pre-circuit assemblies 24, 25 are removed by use of a selective etching process, and area or region 26 is generally circular or cylindrical in shape. Once the portions of pre-circuit assemblies 24, 25 are removed from area or region 26, at least one aperture or hole 154 is formed within dielectric layers 14 and core 12. Aperture 154 is formed by use of a conventional "tapered" drill which is inserted into both sides of aperture 152 (e.g. the "top" side and of the "bottom" side) to form the "pointed" or tapered surface 156. In other alternate embodiments, the aperture 154 is formed by selective etching and/or ablating. Once pointed or tapered surface 156 is formed, the surface 156 may be selectively etched in a conventional manner to form rounded or curved surface 158 as shown in FIG. 9a. Rounded surface 158 of core 12 provides an increased "wetting" surface and substantially ensures that solder material introduced or inserted into aperture 152 wets or metallurgically bonds with core 12. For example and without limitation, as shown in FIG. 9a, the solder material, "solder slug" or other electrically conductive material 36 which is inserted into aperture 152 substantially contacts and wets rounded surface 158 of core 12. In the case of "solder", a "wicking" action completes the "wetting" and forms a robust and reliable physical and electrical connection between conductive members or layers 18 and ground or core member 12. In other alternate embodiments, additional portions of epoxy layers 18 are laser ablated from core 12, thereby exposing additional "wetting" surfaces.

Figure 10:
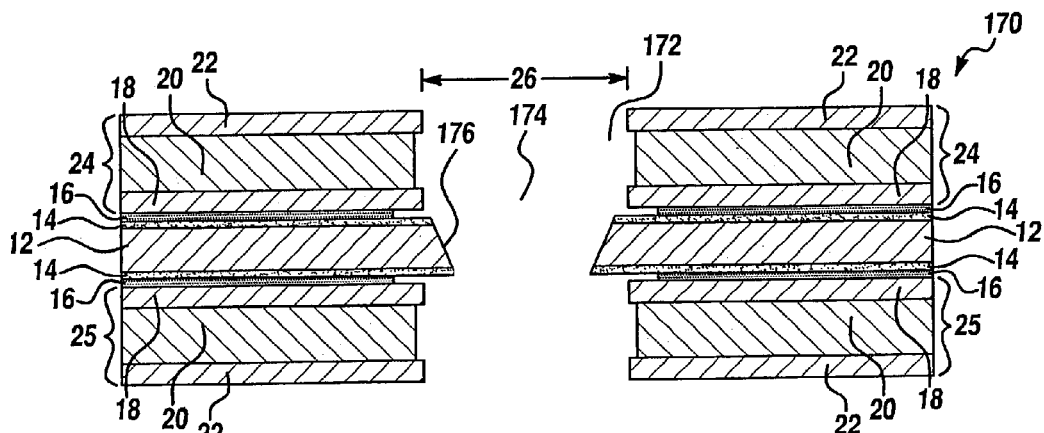
FIGS. 10 and 10a are sectional side views of a multi-layer circuit board including an aperture made in accordance with the teachings of an eighth embodiment of the invention.
Figure 10A:
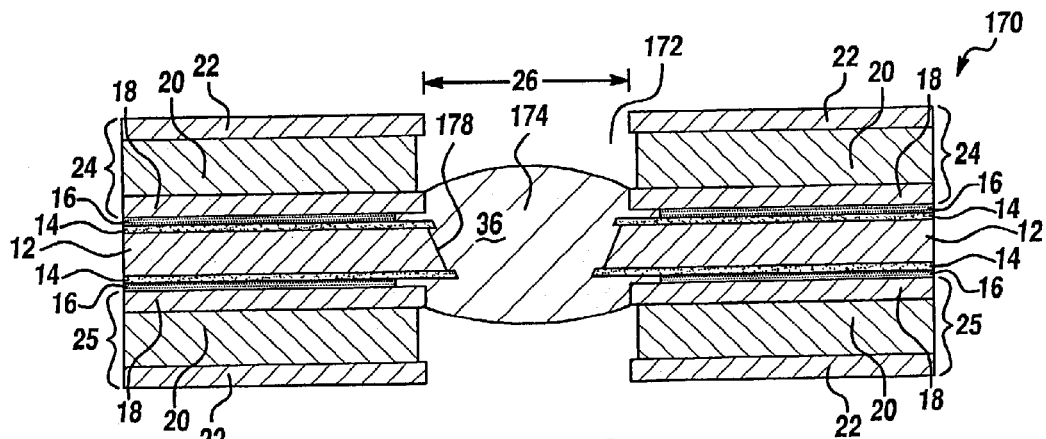

Referring now to FIGS. 10 and 10a, there is shown a circuit assembly 170 made in accordance with the teachings of an eighth embodiment of the invention. Circuit assembly 170 is substantially identical to circuit assembly 50 with the exception that via or aperture 52 has been replaced by via or aperture 172.

Particularly, to form aperture 172, portions of pre-circuit assemblies 24, 25 and adhesive layers 16 are first removed from area or region 26 of the circuit assembly 170 in a known and conventional manner such as by drilling, ablating, and/or selective etching. In the preferred embodiment, the portions of pre-circuit assemblies 24, 25 are removed by use of a selective etching process, and area or region 26 is generally circular or cylindrical in shape. Once the portions of pre-circuit assemblies 24, 25 are removed from area or region 26, at least one aperture or hole 174 is formed within dielectric layers 14 and core 12. Aperture 174 is formed by a conventional machining process, such as drilling, ablating or routing such that tapered surface 176 forms a substantially circular perimeter around aperture 174. In the preferred embodiment, a tapered drill is used in a conventional manner on one side of core 12 and dielectric layers 14 to form tapered surface 176. Once tapered surface 176 is formed, surface 176 is etched in a conventional manner to create recessed tapered surface 178 as shown in FIG. 10a. Tapered surface 178 of core 12 substantially ensures that solder material introduced or inserted into apertures 170, 172 wets or metallurgically bonds with core 12. For example and without limitation, as shown in FIG. 10a, the solder material, "solder slug", or other electrically conductive material 36 which is inserted into aperture 172 substantially contacts and wets tapered surface 178 of core 12. In the case of "solder", a "wicking" action completes the "wetting" and forms a robust and reliable physical and electrical connection between conductive members or layers 18 and ground or core member 12.

Figure 11:
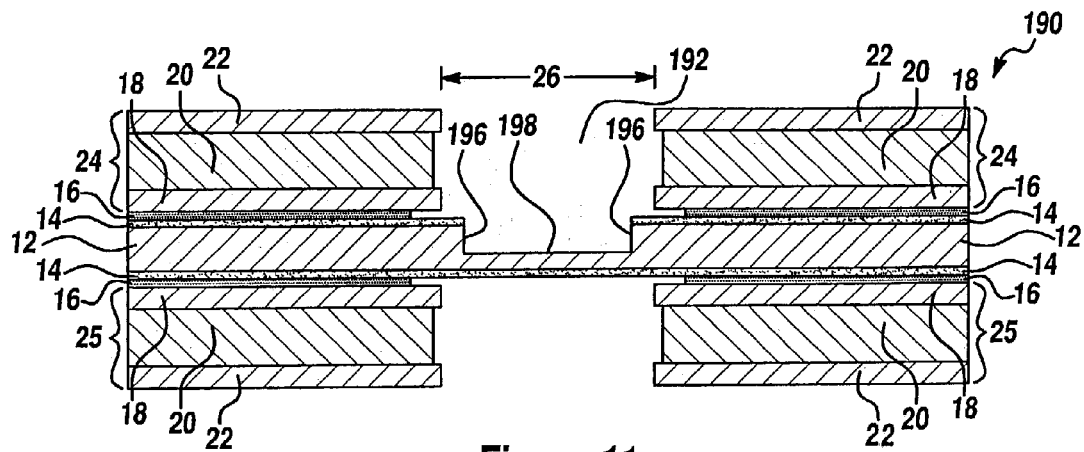
FIGS. 11 and 11a are sectional side views of a multi-layer circuit board including an aperture made in accordance with the teachings of a ninth embodiment of the invention.
Figure 11A:
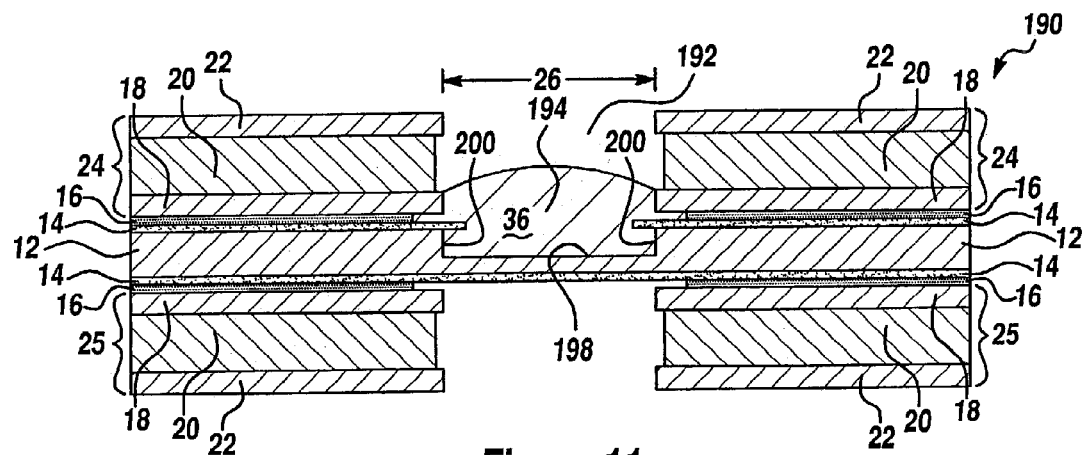

Referring now to FIGS. 11 and 11a, there is shown a circuit assembly 190 made in accordance with the teachings of a ninth embodiment of the invention. Circuit assembly 190 is substantially identical to circuit assembly 50 with the exception that via or aperture 52 has been replaced by via or aperture 192.

Particularly, to form aperture 192, portions of pre-circuit assemblies 24, 25 and adhesive layers 16 are first removed from area or region 26 of the circuit assembly 190 in a known and conventional manner such as by drilling, punching, laser ablation and/or selective etching. In the preferred embodiment, the portions of pre-circuit assemblies 24, 25 are removed by use of a selective etching process, and area or region 26 is generally circular or cylindrical in shape. Once the portions of pre-circuit assemblies 24, 25 are removed from area or region 26, at least one aperture or hole 194 is formed within "top" dielectric layer 14 and core 12. Aperture 194 is formed by a conventional machining process, such as drilling, routing, and/or ablating such that surface 196 forms a substantially circular perimeter of aperture 194. Once aperture 194 is formed, side surface 196 is etched back in a conventional manner to form recessed side surface 200 as shown in FIG. 11a. Side surface 200 and bottom surface 198 of core 12 substantially ensure that solder material introduced or inserted into aperture 192 wets or metallurgically bonds with core 12. For example and without limitation, as shown in FIG. 11a, the solder material or "solder slug" 36 which is inserted into aperture 192 substantially contacts and wets side surface 200 and bottom surface 198 of core 12 and forms a robust and reliable physical and electrical connection between conductive member or layer 18 of pre-circuit assembly 24 and ground or core member 12.

Figure 12:
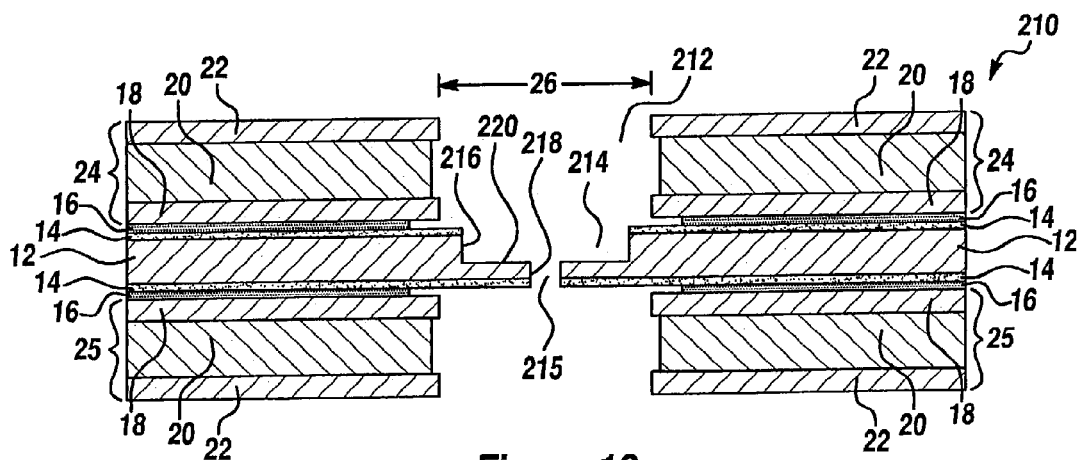
FIGS. 12 and 12a are sectional side views of a multi-layer circuit board including an aperture made in accordance with the teachings of a tenth embodiment of the invention.
Figure 12A:
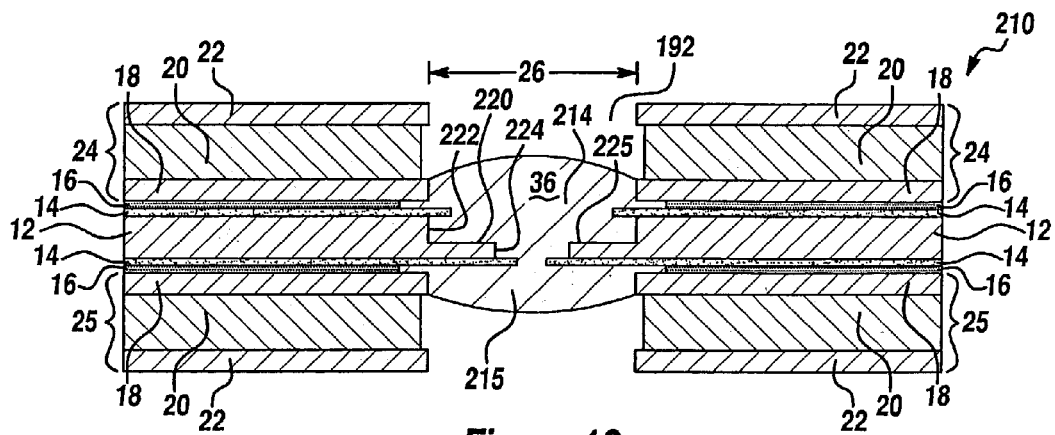

Referring now to FIGS. 12 and 12a, there is shown a circuit assembly 210 made in accordance with the teachings of a tenth embodiment of the invention. Circuit assembly 210 is substantially identical to circuit assembly 190 with the exception that via or aperture 192 has been replaced by via or aperture 212.

To form aperture 212, portions of pre-circuit assemblies 24, 25 and adhesive layers 16 are first removed from area or region 26 of the circuit assembly 210 in a known and conventional manner such as by drilling, routing, laser ablation, and/or selective etching. In the preferred embodiment, the portions of pre-circuit assemblies 24, 25 are removed by use of a selective etching process, and area or region 26 is generally circular or cylindrical in shape. Once the portions of pre-circuit assemblies 24, 25 are removed from area or region 26, an aperture or hole 214 is formed within "top" dielectric layer 14 and core 12. Aperture 214 is formed by a conventional machining process, such as drilling, routing, and/or ablating such that surface 216, defines a substantially circular perimeter of aperture 214. A second aperture 215 is formed within core 12 and "bottom" dielectric layer 14 and includes a surface 218 which defines or forms the perimeter of aperture 215. In one preferred embodiment, aperture 214 is formed by drilling or machining through approximately a first half of core 12 to form surfaces 216 and 220, and then drilling a smaller diameter hole through approximately the second half of core 12 to form surface 218. Once apertures 214 and 215 are formed, side surfaces 216, 218 are etched in a conventional manner to form recessed side surfaces 222, 224 and an edge or corner 225 as shown in FIG. 12a. Side surfaces 222, 224, edge 225 and surface 220 of core 12 substantially ensure that solder material introduced or inserted into apertures 192, 214 wets or metallurgically bonds with core 12. For example and without limitation, as shown in FIG. 12a, the solder material, conductive material or "solder slug" 36 which is inserted into aperture 214 substantially contacts and wets side surfaces 222, 224, edge 225 and surface 220 of core 12 and forms a robust and reliable physical and electrical connection between conductive members or layers 18 and ground or core member 12.

Figure 13:
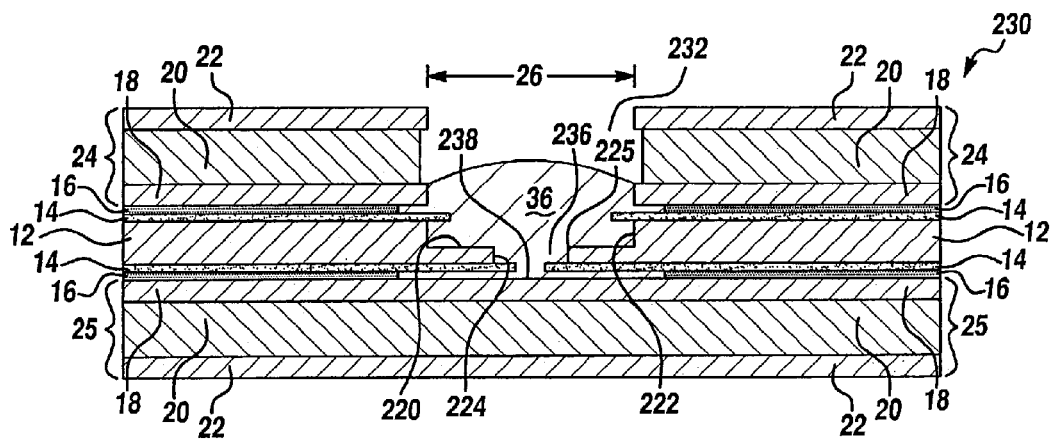
FIG. 13 is a sectional side view of a multi-layer circuit board including an aperture which is made in accordance with the teachings of an eleventh embodiment of the invention.

Referring now to FIG. 13, there is shown a circuit assembly 230 made in accordance with the teachings of a preferred embodiment of the invention. Circuit assembly 230 is substantially identical to circuit assembly 210 with the exception that via or aperture 212 has been replaced by via or aperture 232.

Particularly, no portion(s) of pre-circuit assembly 25 has been removed from area or region 26 and thus, aperture 232 is a "blind" type via. A portion 238 of conductive layer 18 is exposed within or at the "bottom" of via 232. Exposed portion 238 of layer 18 and portions 220, 222, and 224 and 225 of core 12 substantially and cooperatively ensure that solder material introduced or inserted into aperture 232 wets or metallurgically bonds with layers 18 and core 12. For example and without limitation, as shown in FIG. 13, the solder material, "solder slug", or other electrically conductive material 36 which is inserted into aperture 214 substantially contacts and wets exposed portions 238, 220, 222, 224 and 225 and forms a robust and reliable physical and electrical connection between conductive members or layers 18 and ground or core member 12.

It will be appreciated that any of the apertures or vias illustrated in FIGS. 9–13 can be used as desired in combination with the apertures shown in FIGS. 3–8. It will further be appreciated that, although the foregoing apertures have been described as having substantially circular perimeters, they may also be of any other suitable shape.

It should be understood that the invention is not limited to the exact embodiment or construction which has been illustrated and described but that various changes may be made without departing from the spirit and the scope of the invention. This includes, by way of example and without limitation, all methods of hole formation, all types of hole geometries and all types of electrical conductive materials.

What is claimed is:

1. A multi-layer circuit board comprising:
   a first conductive layer; and
   a first and a second insulating layer, said first conductive layer disposed between said first and said second insulating layer;
   wherein an aperture has been formed in said first conductive layer and a portion of said first insulating layer has been removed such that a portion of said first conductive layer extends beyond said first insulating layer.

2. The multi-layer circuit board of claim 1, further comprising:
   a second aperture through said first conductive layer, said first insulating layer and said second insulating layer, said second aperture being formed in relatively close proximity to said first aperture.

3. The multi-layer circuit board of claim 1 further including a second conductive layer, wherein said second conductive layer is metallurgically bonded to said first conductive layer with solder.

4. The multi-layer circuit board of claim 3 wherein said second conductive layer includes a second aperture having a perimeter which is disposed outside of said first aperture.

5. The multi-layer circuit board of claim 1 wherein said first conductive layer comprises a copper core member.

6. The multi-layer circuit board of claim 2 wherein said first aperture and said second aperture are intersecting to cooperatively form a single aperture.

7. A multi-layer circuit board comprising:
   a first and a second insulating layer and a first conductive layer which is disposed between said first and said second insulating layers, wherein a first aperture is formed through said first conductive layer, said first insulating layer and said second insulating layer in a manner effective to cause a portion of said first insulating layer to separate from a portion of said first conductive layer, thereby exposing said portion of said first conductive layer; and
   a solder material which is disposed within said aperture effective to wet said portion of said first conductive layer, thereby metallurgically bonding said solder material to said first conductive layer.

8. The multi-layer circuit board of claim 7 further having a second aperture formed through said first conductive layer, said first insulating layer and said second insulating layer, said second aperture being formed in relative close proximity to said first aperture, and being effective to cause additional portions of said first insulating layer to be separated from said first conductive layer.

9. The multi-layer circuit board of claim 8 wherein said second conductive layer includes a second aperture having a perimeter which is disposed around said first aperture.

10. The multi-layer circuit board of claim 7 wherein said first conductive layer comprises a copper core member.

11. The multi-layer circuit board of claim 8 wherein said first aperture and said second aperture intersect to form a single aperture.

12. A multi-layer circuit board comprising:
   a first and second conductive layer, wherein said second conductive layer has a first aperture;
   a first and a second insulting layer, said first conductive layer being disposed between said first and said second insulating layer;
   wherein a second aperture is formed through said first conductive layer, said first insulating layer and said second insulating layer such that said first aperture has a first side surface at least partially formed from said first conductive layer and such that said first aperture has a perimeter which is disposed outside said second aperture;
   wherein at least a portion of said first side surface is at least partially recessed between said first and second insulating layers; and
   a solder material, which is effective to wet said recessed surface, thereby metallurgically bonding said solder material to said first conductive layer.

13. The multi-layer circuit board of claim 12 wherein said first side surface of said second aperture is tapered.

14. The multi-layer circuit board of claim 13 wherein said at least partially recessed portion of said side surface is an arched surface.

15. The multi-layer circuit board of claim 12 further including a third aperture with a second side surface such that said second aperture and said third aperture together form a fourth aperture which includes said first side surface, said second side surface and an intermediate surface;

wherein at least a portion of said second side surface is at least partially recessed.

16. The multi-layer circuit board of claim 12 wherein said solder material is disposed upon said second conductive layer effective to metallurgically bond said solder material to said second conductive layer and to connect said second conductive layer to said first conductive layer.

17. The multi-layer circuit board of claim 12 wherein said first conductive layer comprises a copper core member.

18. The multi-layer circuit board of claim 7 wherein said multi-layer circuit board further includes:

a second conductive layer;

wherein said conductive material to further effective to wet said second conductive layer, thereby metallurgically bonding said conductive layer to said second conductive layer and connecting said second conductive layer to said first conductive layer.

* * * * *